(12) United States Patent
Baertsoen

(10) Patent No.: US 6,461,180 B2
(45) Date of Patent: Oct. 8, 2002

(54) PRINTED CIRCUIT BOARD ZERO INSERTION FORCE CONNECTOR

(75) Inventor: Peter Baertsoen, Zulte (BE)

(73) Assignee: Tyco Electronics Belgium EC N.V. (BE)

( * ) Notice: Subject to any disclaimer, the term of this patent is extended or adjusted under 35 U.S.C. 154(b) by 0 days.

(21) Appl. No.: 09/784,908

(22) Filed: Feb. 16, 2001

(65) Prior Publication Data

US 2001/0017760 A1 Aug. 30, 2001

(30) Foreign Application Priority Data

Feb. 18, 2000 (EP) .............................. 00103506

(51) Int. Cl.⁷ ................................ H01R 13/62
(52) U.S. Cl. .................. 439/260; 439/267; 439/64; 439/157
(58) Field of Search ................ 439/157, 261, 439/267, 64, 260, 266

(56) References Cited

U.S. PATENT DOCUMENTS

| 3,853,379 | A |   | 12/1974 | Goodman et al. | 439/261 |
|---|---|---|---|---|---|
| 4,047,781 | A |   | 9/1977 | Yeager | 439/267 |
| 6,116,934 | A | * | 9/2000 | Longueville | 439/260 |
| 6,206,713 | B1 | * | 3/2001 | Baertsoen et al. | 439/260 |

FOREIGN PATENT DOCUMENTS

| DE | 197 42 400 A1 | 4/1999 |
|---|---|---|
| EP | 0 319 308 A1 | 6/1989 |
| WO | WO 98/58426 | 12/1998 |

* cited by examiner

Primary Examiner—Tho D. Ta

(57) ABSTRACT

A printed circuit board zero insertion force connector incorporating an actuating member, by which the printed circuit board zero insertion force connector can be moved from an assembly position permitting insertion or removal of a printed circuit board into a connecting position properly contacting the printed circuit board and/or vice versa, is made by means of an element which simultaneously serves to lock the printed circuit board to the arrangement containing the printed circuit board zero insertion force connector or to remove it therefrom.

4 Claims, 3 Drawing Sheets

PRINTED CIRCUIT BOARD ZERO INSERTION FORCE CONNECTOR

BACKGROUND OF THE INVENTION

The present invention relates to a printed circuit board zero insertion force connector utilizing an actuating member to move the connector from an assembly position permitting insertion or removal of a printed circuit board into a connecting position properly contacting the printed circuit board and/or vice versa.

DESCRIPTION OF THE PRIOR ART

Printed circuit board zero insertion force connectors serve to connect two printed circuit boards to one another without any expenditure of force or at least without any significant expenditure of force during insertion of the printed circuit board. Printed circuit board zero insertion force connectors have been known for a long time and in various embodiments.

For example, in U.S. Pat. No. 3,130,351, the printed circuit board zero insertion force connector known from this publication is securely mounted on one of the printed circuit boards to be connected to one another. The connector is designed in such a way that the other printed circuit board to be connected to one another can be inserted therein. The connector is moved by actuating an actuating member formed by a rod, more precisely by pulling on this rod, into an assembly position permitting insertion or removal of a printed circuit board and can be moved into a connecting position properly contacting the printed circuit board by inserting a printed circuit board.

Experience has shown that there are sometimes problems with printed circuit board zero insertion force connectors of this type: on the one hand, it cannot always be guaranteed that a proper electrical connection is made between the printed circuit board zero insertion force connector and the printed circuit board inserted therein and, on the other hand, damage to the printed circuit board zero insertion force connector and/or a printed circuit board to be inserted therein during insertion of the printed circuit board into the printed circuit board zero insertion force connector or removal therefrom cannot be ruled out. Understandably, these are considerable disadvantages.

SUMMARY OF THE INVENTION

The object of the present invention is therefore to develop the printed circuit board zero insertion force connector in such a way that printed circuit boards to be inserted therein can always be reliably brought into contact with the printed circuit board zero insertion force connector as required and without damage to the printed circuit boards and/or to the printed circuit board zero insertion force connector.

This object is achieved according to the invention by a printed circuit board zero insertion force connector where the actuating member is actuated by actuating an element which simultaneously serves to lock the printed circuit board to the arrangement containing the printed circuit board zero insertion force connector or to remove it therefrom. As a result a printed circuit board to be inserted into the printed circuit board zero insertion force connector can be locked to the assembly containing the printed circuit board zero insertion force connector or removed therefrom and the printed circuit board zero insertion force connector can be moved into the assembly position or into the connecting position by actuating just one element.

Furthermore, a printed circuit board can be inserted into the printed circuit board zero insertion force connector not only extremely quickly and easily, but also without the risk of damage to the printed circuit board zero insertion force connector and/or to the printed circuit board and without the risk of an improper connection between the printed circuit board zero insertion force connector and the printed circuit board.

In particular it is ensured by the present invention that the printed circuit board zero insertion force connector can only be moved into the connecting position when the printed circuit board to be inserted into the printed circuit board zero insertion force connector is in the position prescribed for this purpose; that the printed circuit board is locked in its required position and is therefore secured against removal from the printed circuit board zero insertion force connector when and as long as the printed circuit board zero insertion force connector is in the connecting position; and that the printed circuit board is not secured to the assembly containing the printed circuit board zero insertion force connector when the printed circuit board zero insertion force connector is in the assembly position. Therefore, operating errors can be reliably ruled out.

The claimed printed circuit board zero insertion force connector allows printed circuit boards to be inserted therein to always be reliably brought into contact with the printed circuit board zero insertion force connector as required and without damage to the printed circuit board and/or to the printed circuit board zero insertion force connector. Advantageous developments of the invention can be inferred from the dependent claims, the description below and the figures.

DETAILED DESCRIPTION OF THE PREFERRED EMBODIMENT

Figure 1:
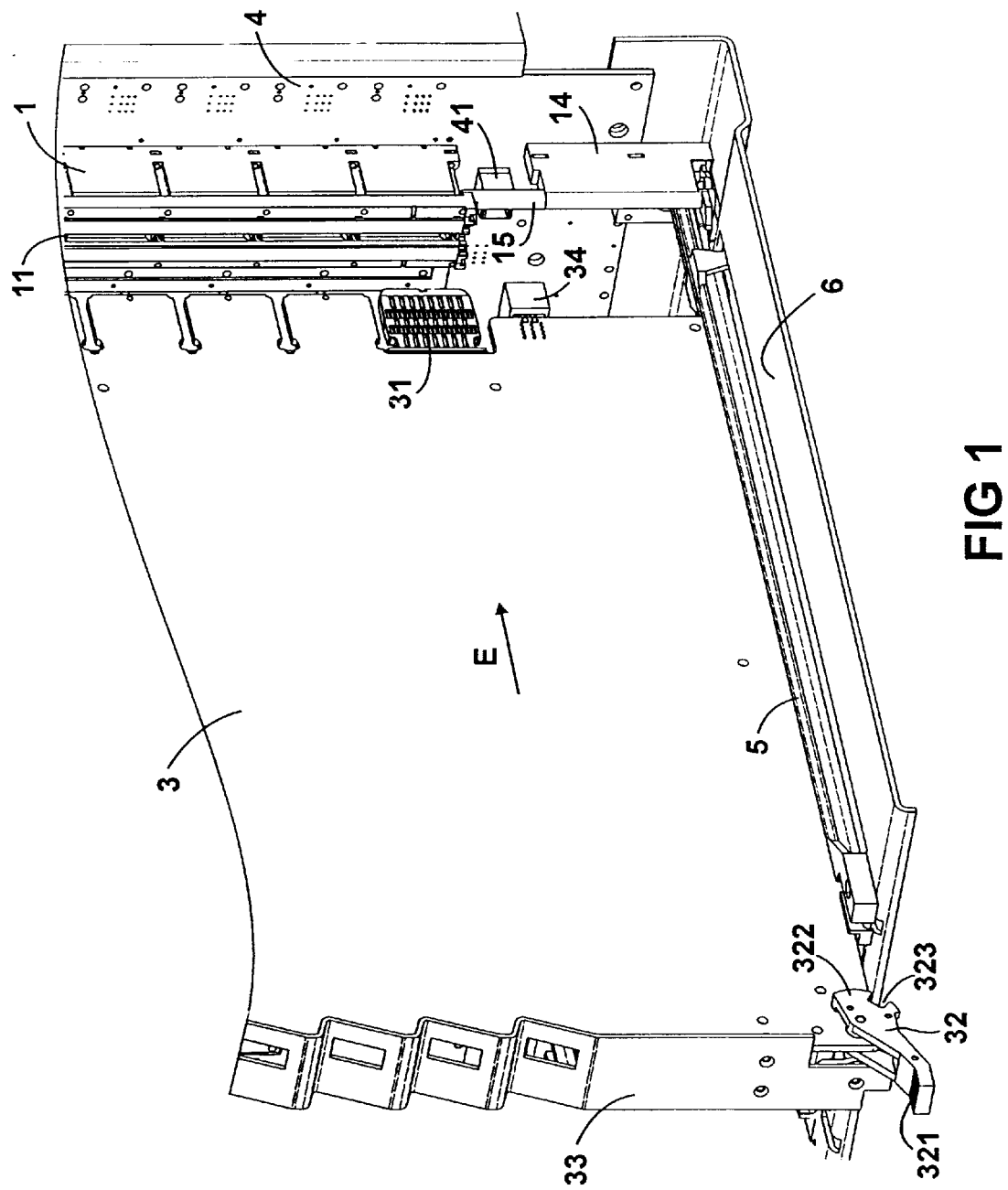
FIG. 1 shows a perspective view of an assembly containing the printed circuit board zero insertion force connector described in more detail below.

The printed circuit board zero insertion force connector described in more detail below is in addition designed to electrically connect to two printed circuit boards arranged substantially perpendicular to one another (to be placed on one another perpendicularly). The use of the printed circuit board zero insertion force connector according to the invention is not however restricted to such cases. Owing to the printed circuit board zero insertion force connector of the type described, printed circuit boards may be connected to one another in any relative position.

The printed circuit board zero insertion force connector described in more detail below is designated by the reference numeral 1 in the drawings. The printed circuit boards, which are to be connected by this printed circuit board zero insertion force connector 1, are a first printed circuit board 3 and a second printed circuit board 4. The first printed circuit board 3 is placed substantially perpendicularly to the second printed circuit board 4. Printed circuit boards of the type according to the second printed circuit board 4 are, for example, the so-called back wall printed circuit boards. The printed circuit boards which can be placed thereon of the type according to the first printed circuit board 3 are often called plug-in cards in accordance with their mode of assembly.

The printed circuit board zero insertion force connector 1 is securely mounted on the second printed circuit board 4. In the process, the printed circuit board zero insertion force connector 1 and the second printed circuit board 4 are securely and reliably connected to one another both mechanically and electrically.

The printed circuit board zero insertion force connector 1 has a slot 11 extending over the entire length of the printed circuit board zero insertion force connector 1 on the side where the first printed circuit board 3 is to be inserted into the printed circuit board zero insertion force connector. Two connector halves (not shown in the drawings) are provided in the interior of the printed circuit board zero insertion force connector, more precisely, on both sides of the slot 11, which connector halves can be pivoted or folded toward or away from one another by actuating a pivoting mechanism 12 provided laterally on the printed circuit board zero insertion force connector 1.

As the connector halves pivot apart, they distance themselves from one another at their end facing the slot 11 (where contacts are normally exposed), so that a gap or space existing therebetween widens. When, and as long as the gap or space (preferably located precisely under the slot 11) has widened, a first printed circuit board 3 can be inserted therein. The position of the printed circuit board zero insertion force connector 1, in which its connector halves are folded back from one another, is therefore called its assembly position.

As the connector halves pivot together, they move toward one another, so that the gap or space existing between them becomes narrower. When and as long as the gap or space is constricted, a first printed circuit board 3 optionally inserted therein is more or less securely clamped between the connector halves. In the embodiment, contact elements 31 provided on the first printed circuit board 3 electrically contact contact elements provided on the connector halves and via these electrically contact the second printed circuit board 4. The position of the printed circuit board zero insertion force connector 1, in which its connector halves are folded together, is therefore called its connecting position.

For the sake of completeness it is noted that the contact elements 31 of the first printed circuit board 3 in the example under consideration are surface contacts and that the contact elements provided on the connector halves are contact springs which come to rest on the surface contacts 31 of the first printed circuit board 3 when the connector halves are pivoted together.

FIG. 1 shows an assembly in which the first printed circuit board 3 is inserted in the direction of an arrow E into the printed circuit board zero insertion force connector 1 mounted on the second printed circuit board 4. The end of the first printed circuit board 3 bearing the surface contacts 31 to be inserted in the printed circuit board zero insertion force connector 1 is located directly in front of the printed circuit board zero insertion force connector. As will be described in more detail, the printed circuit board zero insertion force connector is in the assembly position in this stage. In other words, the connector halves are pivoted away from one another, so that the first printed circuit board 3 can be inserted substantially without expenditure of force via the slot 11 of the printed circuit board zero insertion force connector 1 between its connector halves.

The first printed circuit board 3 is guided along the path toward and away from the printed circuit board zero insertion force connector by printed circuit board guides. The printed circuit board guides are, for example, a pair of guide rails between which the printed circuit board is guided and held. Printed circuit board guide devices of this and other types have been known for many years in various embodiments and do not require further explanation. The drawings show only one of the printed circuit board guides. This printed circuit board guides 5 is mounted, in the example under consideration, on a frame part 6 which is in turn connected to the second printed circuit board 4. The printed circuit board guides and/or the devices supporting them such as the mentioned frame part, can be provided on other parts (for example, on the housing) and/or on any other points of the assembly containing the printed circuit board zero insertion force connector.

A rod-like element 13 that can be displaced in a longitudinal direction extends through at least one of the printed circuit board guides 5 or adjacent to at least one of the printed circuit board guides 5 substantially over its entire length. This rod-like element 13 serves as an actuating member by which actuation of the printed circuit board zero insertion force connector from the assembly position into the connecting position and from the connecting position into the assembly position can be achieved. In the example under consideration, the printed circuit board zero insertion force connector 1 is moved from the assembly position into the connecting position when the rod-like element 13 is withdrawn from the printed circuit board zero insertion force connector and the printed circuit board zero insertion force connector 1 is moved from the connecting position into the assembly position when the rod-like element 13 is pushed toward the printed circuit board zero insertion force connector.

The construction and the drive of the above-mentioned rod-like element 13, by means of which the printed circuit board zero insertion force connector can be moved from the assembly position into the connecting position and vice versa, through a pivoting mechanism 12,14. The movements of the rod-like element 13 (actuations of the actuating member) are converted into movements of the pivoting mechanism 12 by pivoting mechanism drive 14 are illustrated in FIGS. 2 to 4.

Figure 2:
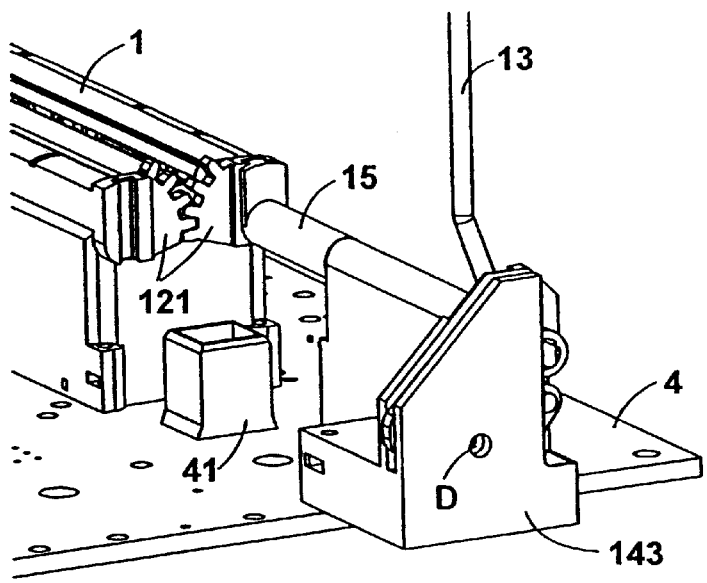
FIG. 2 shows a perspective view of a pivoting mechanism for the printed circuit board zero insertion force connector shown in FIG. 1.
Figure 3:
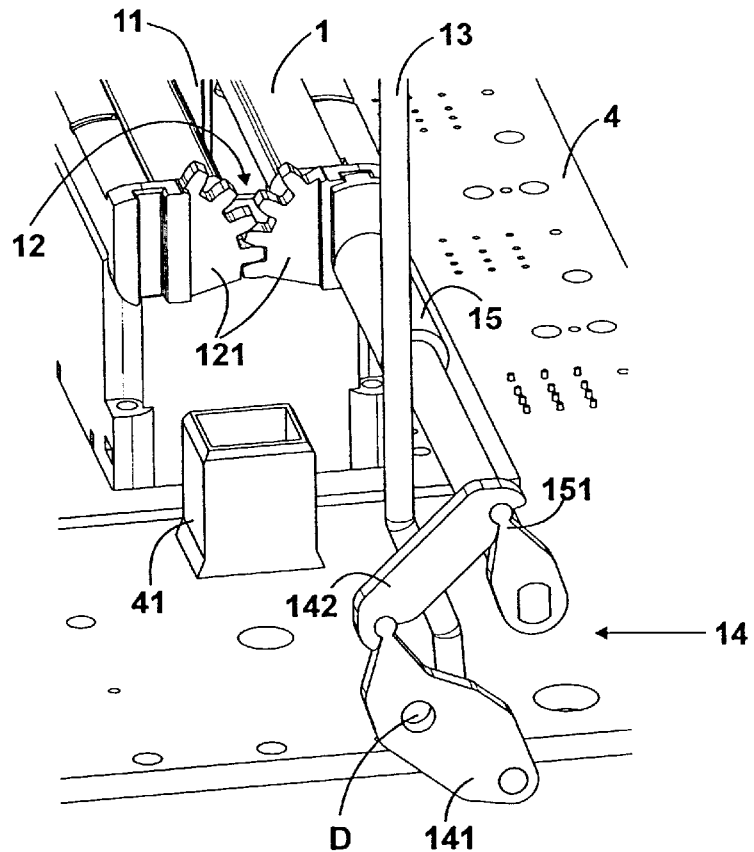
FIG. 3 shows the pivoting mechanism according to FIG. 2 when the printed circuit board zero insertion force connector is in an assembly position.
Figure 4:
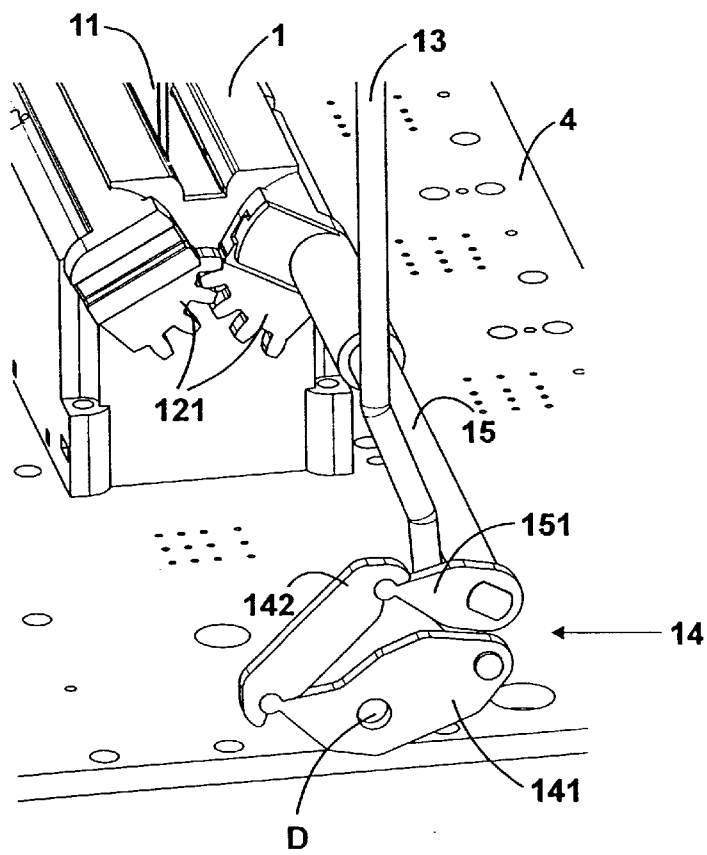
FIG. 4 shows the pivoting mechanism according to FIG. 2 when the printed circuit board zero insertion force connector is in a connecting position.

As can be seen from FIGS. 2 to 4 in particular, the pivoting mechanism 12 is driven not directly by the rod-like elements 13 but via a separate pivoting mechanism drive 14. The drive 14 in the example under consideration, is formed by a rod 15 rotatable about its longitudinal axis. The rod 15 is connected to one of the connector halves of the printed circuit board zero insertion force connector or to an element coupled thereto. The rotation of rod 15 induces a rotation or pivoting of one of the connector halves, so that a rotation of the rod 15 induces a rotation or pivoting of the associated connector half in the direction of rotation of the rod 15. The other connector half (the element causing a rotation or pivoting of the other connector half) is coupled via gear wheels 121 to the one connector half (the element causing the rotation or pivoting of the one connector half), so that the connector halves move in opposite directions to one another in each case. Owing to the opposing movements of the connector halves, they are pivoted toward or away from one another depending on the direction of rotation of the rod 15.

In the example under consideration, rotation of the rod 15 in a clockwise direction causes the printed circuit board zero insertion force connector to move from the connecting position into the assembly position, whereas rotation of the rod 15 in an anticlockwise direction causes the printed circuit board zero insertion force connector to move from the assembly position into the connecting position.

The (displacement) movement of the rod-like element 13 is converted into the (rotational) movement of the rod 15 via the above-mentioned pivot element drive 14. Owing to the pivot element drive 14, a movement of the rod-like element 13 away from the printed circuit board zero insertion force connector is converted into a rotational movement of the rod 15 in an anticlockwise direction, and a movement of the rod-like element 13 toward the printed circuit board zero insertion force connector is converted into a rotational movement of the rod 15 in a clockwise direction. The pivot element drive 14 is accommodated in a separate housing 143 that is arranged adjacent to the printed circuit board zero insertion force connector on the second printed circuit board 4. The pivot element drive 14 consists of a two-armed lever 141 mounted rotatably about a stationary pivot D and a coupling member 142. One end of the lever 141 is connected to the rod-like element 13 and the other end of the lever 141 is connected, via the coupling member 142, (or potentially also directly) to the rod 15 (more precisely to a lateral projection 151 of the rod 15).

FIG. 3 shows the relative position which the above-mentioned parts of the conversion mechanism 14 assume when the printed circuit board zero insertion force connector is in the assembly position. If the rod-like element 13 is pulled away from the printed circuit board zero insertion force connector in this state then the lever 141 rotates anticlockwise and this movement is transmitted via the coupling member 142 to the shaft 15 which similarly rotates anticlockwise as a result. Rotation of the shaft 15 anticlockwise causes the connector halves to be pivoted toward one another, so that the printed circuit board zero insertion force connector is moved into the connecting position.

FIG. 4 shows the relative position of the pivot element drive 14 components when the printed circuit board zero insertion force connector is in the connecting position. If the rod-like element 13 is pushed toward the printed circuit board zero insertion force connector in this state then the lever 141 rotates clockwise and this movement is transmitted via the coupling member 142 to the shaft 15 which similarly rotates clockwise as a result. Rotation of the shaft 15 in a clockwise direction causes the connector halves to be pivoted apart, so that the printed circuit board zero insertion force connector is moved into the assembly position.

The displacement of the rod-like element 13 which, as described above, is the trigger for moving the printed circuit board zero insertion force connector from the assembly position into the connecting position or vice versa, is made in the example under consideration by actuating an element which simultaneously serves to lock the printed circuit board to the arrangement containing the printed circuit board zero insertion force connector or to remove it therefrom. In the example under consideration, this element 32 is a two-armed lever that is provided on the end of the first printed circuit board 3 remote from the printed circuit board zero insertion force connector. If a plurality of rod-like elements 13 or other actuating members are provided for operating the printed circuit board zero insertion force connector, a plurality of levers 32 or other elements for actuating the actuating members may also be provided (one actuating element per actuating member).

Figure 5:
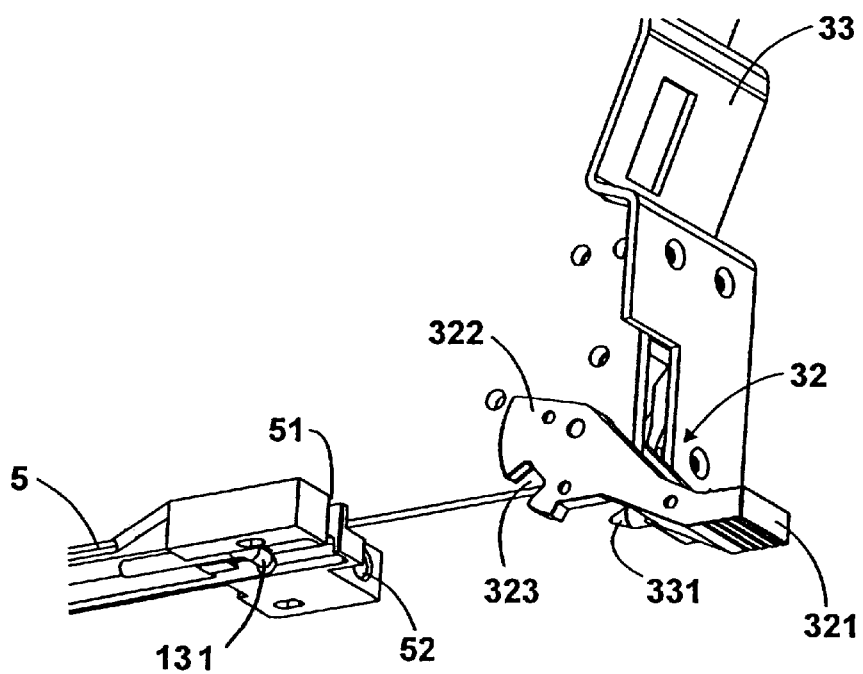
FIG. 5 shows a perspective view illustrating actuation of an actuating member where the movement of which will converted by the pivoting mechanism according to FIGS. 2 to 4 into a movement of a pivoting mechanism drive device driving the pivoting mechanism.

In the position of the lever 32 shown in FIG. 1 and 5, the lever 32, or more precisely its one lever arm 321, can be used by the person who inserts the first printed circuit board 3 into the printed circuit board zero insertion force connector 1 or removes the first printed circuit board 3 from the printed circuit board zero insertion force connector 1 as a handle with the aid of which the first printed circuit board 3 can be pushed toward the printed circuit board zero insertion force connector or can be withdrawn from the printed circuit board zero insertion force connector without having to touch the printer circuit board itself. When the first printed circuit board 3 has reached its required position, the lever 32 is pushed. In the case of the lever 32 shown in FIGS. 1 and 5, this is effected through part 321 of the lever 32 (the lever arm 321) that is projecting back beyond the printed circuit board is pushed upwards until it extends approximately parallel to the trailing edge of the first printed circuit board 3.

During this movement, the other part (the other arm) 322 of the lever 32 comes into contact with the rod-like element 13. More precisely, the end 131 of the rod-like element 13 (curved or T-shaped in the example under consideration) comes to rest in a notch 323 of the lever 32 in the process and is withdrawn from the printed circuit board zero insertion force connector by pushing the lever 32 round further. The withdrawal of the rod-like element 13 from the printed circuit board zero insertion force connector is converted by the conversion mechanism 14 into a rotational movement of the rod 15 in an anticlockwise direction, so that the printed circuit board zero insertion force connector is moved from the assembly position into the connecting position.

When the lever 32 is pushed as described, parts of the arm 322 protrude through associated slots 51 in the printed circuit board guides 5. These slots 51 are arranged and/or dimensioned in such a way that the lever arm 322 only contacts them and/or passes through them when the first printed circuit board 3 is in the position to be properly connected to the printed circuit board zero insertion force connector 1. In all other positions of the first printed circuit board 3 attempts to push the lever 32 will cause the lever 32, more precisely the arm 322 thereof, to impinge on the printed circuit board guide devices 5 and either not to be moved at all or to be moved only slightly as a result. Owing to the fact that the lever 32 cannot be moved or can only be moved slightly, the rod-like element 13 can also not be withdrawn from the printed circuit board zero insertion force connector 1, in other words the printed circuit board zero insertion force connector 1 cannot be moved into the connecting position.

When the first printed circuit board 3 is removed from the printed circuit board zero insertion force connector 1, the reverse processes take place. In other words, the lever 32 is pushed downwards which automatically causes part 131 of the rod-like element 13 located in the notch 323 of the lever arm 322 together with the entire rod-like element to be displaced toward the printed circuit board zero insertion force connector 1. Pushing the rod-like element 13 toward the printed circuit board zero insertion force connector 1 is converted by the pivot element drive 14 into a movement of the rod 15 that is clockwise, so that the printed circuit board zero insertion force connector 1 is moved from the connecting position into the assembly position.

The lever 32 has a further function apart from displacing the rod-like element 13. By virtue of the lever, the first printed circuit board 3 can be locked to the assembly containing the printed circuit board zero insertion force connector. This is achieved by the interaction of the above-mentioned slot 51 of the printed circuit board guide 5 and the lever arm 322. As the lever arm 322 can only penetrate slot 51 of the printed circuit board guide 5 when the first printed circuit board 3 is in its required position (its required relative position with respect to the printed circuit board zero insertion force connector) and the first printed circuit board 3 cannot leave its required position when and as long as the lever arm 322 projects through the slot 51 of the printed circuit board guide 5, the first printed circuit board 3 is fixed by pushing the lever 32 so that it is engaged to the printed circuit board guide 5 (or another part of the arrangement containing the printed circuit board zero insertion force connector). To release this connection, the lever 32 has to be pushed back.

Actuating the actuating member of the printed circuit board zero insertion force connector 1 (displacing the rod-like element 13) by means of the lever 32, in other words by means of an element which simultaneously serves to lock the first printed circuit board 3 to be inserted into the printed circuit board zero insertion force connector 1 to the assembly containing the printed circuit board zero insertion force connector 1 or to remove it therefrom has proved to be advantageous in two respects: on the one hand, because only one element has to be actuated in order to lock the first printed circuit board 3 in its required position and to move the printed circuit board zero insertion force connector 1 into the connecting position (in order to release the first printed circuit board 3 from the arrangement containing the printed circuit board zero insertion force connector 1 and to move the printed circuit board zero insertion force connector 1 into the assembly position) and, on the other hand, because all actions which have to be carried out during insertion and removal of a printed circuit board into and from the printed circuit board zero insertion force connector 1 in order to prevent damage to the printed circuit board zero insertion force connector 1 and/or the printed circuit board and in order to ensure a proper connection between the printed circuit board zero insertion force connector and the printed circuit board take place automatically, the correct sequencing is assured.

In particular, the printed circuit board zero insertion force connector 1 can only be moved into the connecting position when the printed circuit board 3 to be inserted into the printed circuit board zero insertion force connector 1 is in the position intended for this purpose, it is ensured that when the printed circuit board 3 is inserted into the printed circuit board zero insertion force connector 1, it is locked in its required position and thereby secured against removal from the printed circuit board zero insertion force connector 1 when and as long as the printed circuit board zero insertion force connector 1 is in the connecting position, and it is ensured that the printed circuit board 3 is not secured to the assembly containing the printed circuit board zero insertion force connector 1 when the printed circuit board zero insertion force connector 1 is in the assembly position. When and as long as the first printed circuit board 3 is locked to the assembly containing the printed circuit board zero insertion force connector 1 it is in the position (in the relative position with respect to the printed circuit board zero insertion force connector 1) which it must assume in order to be properly connected to the printed circuit board zero insertion force connector 1. As a result, the connection between the printed circuit board zero insertion force connector 1 and a first printed circuit board 3 to be connected to the second printed circuit board 4 is always maintained.

In the example under consideration precautions are taken to ensure that the printed circuit board 3 can always be moved particularly easily, quickly and with reliable precision into position. These precautions include of a (centring) pin 331 provided on the first printed circuit board 3. The pin 331 is on a screen 33 attached to the trailing edge of printed circuit board 3 edge) and extends in the insertion direction E. An associated aperture 52 is formed in the printed circuit board guide 5. When the first printed circuit board 3 is pushed toward the printed circuit board zero insertion force connector 1 the pin 331 moves into the aperture 52, so that the printed circuit board 3 is moved into position which must be properly connected to the printed circuit board zero insertion force connector 1 as the printed circuit board continues to be pushed toward the printed circuit board zero insertion force connector. Instead of the pin 331 and the aperture 52, other positioning mechanisms can be provided to move the first printed circuit board 3 and the printed circuit board guide device 5 and/or other components of the arrangement containing the printed circuit board zero insertion force connector relative to one another into a predetermined relative position. If the first printed circuit board 3 has been guided precisely and without excessive play, by the printed circuit board guide 5, the described or other centring mechanisms can be dispensed with.

The described printed circuit board zero insertion force connector 1 allows printed circuit boards to be inserted therein always to be reliably connected to the printed circuit board zero insertion force connector as required and without damage to the printed circuit boards and/or the printed circuit board zero insertion force connector 1.

The described printed circuit board zero insertion force connector 1 is furthermore characterised in that a plurality of such (identically designed) printed circuit board zero insertion force connectors can be lined up next to one another without intermediate space. It is not necessary in this case for a separate actuating mechanism (rod-like element 13, operating lever 32, conversion mechanism 14, rod 15) to be provided for each of the printed circuit board zero insertion force connectors. It is sufficient if such an actuating mechanism is provided for one of the outer or both outer printed circuit board zero insertion force connectors of the printed circuit board zero insertion force connector series. The pivoting mechanism of the printed circuit board zero insertion force connectors which are not located on the outside can also be driven by an adjacent or both adjacent printed circuit board zero insertion force connector(s). The elements of the printed circuit board zero insertion force connector 1 driven by the rod 15 penetrate the length of the printed circuit board zero insertion force connector and can be coupled to the end of the printed circuit board zero insertion force connector remote from the pivoting mechanism 12 by the pivoting mechanism of an adjacent printed circuit board zero insertion force connector 1. The element driven by the rod 15, more precisely its end provided for driving the pivoting mechanism of an adjacent printed circuit board zero insertion force connector 1 is designed like the end of the rod 15, so that the pivoting mechanism of a printed circuit board zero insertion force connector can be driven without additional resources, optionally by the rod 15 or by an adjacent printed circuit board zero insertion force connector.

A further feature of the described arrangement consists in that the first printed circuit board 3 is connected not only via the printed circuit board zero insertion force connector 1 but additionally via a "normal" connector to the second printed circuit board 4. The electrical connector provided on the second printed circuit board 4 for this purpose is designated by the reference numeral 41 and the electrical connector provided on the first printed circuit board 3 for this purpose is designated by the reference numeral 34.

The described arrangement is therefore superior to conventional arrangements in many respects: it is simpler, quicker and can be operated more reliably, guarantees reliable operation and can be used flexibly.

I claim:

1. A printed circuit board zero insertion force connector comprising:

an actuating member by the actuation of which the printed circit board zero insertion force connector can be moved away from an assembly position permitting insertion or removal of a printed circuit board into a connecting position properly contacting the printed circuit board and vice versa;

an element that actuates the actuating member and simultaneously serves to lock the printed circuit board with an assembly containing the printed circuit board zero insertion force connector or to release it therefrom; and a pivoting mechanism drive coupled to a rod that converts a displacement of the actuating member into a rotation of the rod for the purpose of moving the printed circuit board zero insertion force connector.

2. The printed circuit board zero insertion force connector of claim 1, wherein the pivoting mechanism drive has a two-armed lever having a first end connected to the actuating member and a second end coupled to the rod driving the pivoting mechanism.

3. A printed circuit board zero insertion force connector comprising:

an actuating member by the actuation of which the printed circuit board zero insertion force connector can be moved away from an assembly position permitting insertion or removal of a printed circuit board into a connecting position properly contacting the printed circuit board and vice versa; and a lever having a first and second arm provided at a trailing end of the printed circuit board that actuates the actuating member and simultaneously serves to lock the printed circuit board within an assembly containing the printed circuit board zero insertion force connector or to release it therefrom.

4. The printed circuit board zero insertion force connector of claim 3, wherein the first arm is designed as a handle to be pushed toward the printed circuit board zero insertion force connector and withdrawn from the printed circuit board zero insertion force connector.

* * * * *